TRANSISTOR PUSH-PULL AMPLIFIER

Filed Oct. 3, 1968 3 Sheets-Sheet 1

INVENTOR.
MASAYUKI HONGU
IKUO SHIMIZU

Hill, Sherman, Meroni, Gross & Simpson
ATTORNEYS

INVENTOR.
MASAYUKI HONGU
IKUO SHIMIZU
BY Hill, Sherman, Meroni, Gross & Simpson
ATTORNEYS Dec. 22, 1970 MASAYUKI HONGU ET AL 3,550,024

TRANSISTOR PUSH-PULL AMPLIFIER

Filed Oct. 3, 1968 3 Sheets-Sheet 3

INVENTOR.
MASAYUKI HONGU
IKUO SHIMIZU

BY Hill, Sherman, Meroni, Gross & Simpson
ATTORNEYS

United States Patent Office 3,550,024

Patented Dec. 22, 1970

3,550,024

TRANSISTOR PUSH-PULL AMPLIFIER

Masayuki Hongu and Ikuo Shimizu, Tokyo, Japan, assignors to Sony Corporation, Tokyo, Japan, a corporation of Japan Filed Oct. 3, 1968, Ser. No. 764,690
Claims priority, application Japan, Oct. 13, 1967, 42/65,822
Int. Cl. H03f *3/18, 3/26*
U.S. Cl. 330—15 6 Claims

ABSTRACT OF THE DISCLOSURE

A single-ended push-pull amplifier having two output transistors of the same conductivity type and with a polarity-reversing transistor connected across one of the output transistors. A low impedance element is connected across the polarity-reversing transistor in series with an impedance to obtain an apparent $h_{FE}$ of about one.

BACKGROUND OF THE INVENTION

Field of the invention

This invention relates to a transistorized single-ended type push-pull amplifier, and more particularly to a transistorized single-ended type push-pull amplifier having means for driving push-pull transistors to produce a balanced output signal.

Description of the prior art

There has been well known a single-ended push-pull amplifier of the type in which push-pull output transistors comprising an NPN-type transistor and a PNP-type transistor are connected in series in the forward direction. A driving transistor is connected to the bases of the two transistors and an input terminal is connected to the base of the driving transistor. Such a circuit has no transformer coupling and is capable of push-pull drive of a load. In this case, however, the output stage requires two output transistors of different conductivity types. Generally, it is difficult to obtain an NPN- and a PNP-type transistor of large output such as required at the output stage and having characteristics similar to each other and they are expensive. To avoid such difficulties, it has been proposed to provide a single-ended push-pull amplifier of the type in which the push-pull output transistors are two transistors of the same conductivity type connected in series in the forward direction and one of the transistors is connected to a polarity-reversing transistor. In this case the output of the polarity-reversing transistor need not be so large. However, the forward short-circuit current amplification factor (hereinafter referred to as $h_{FE}$) of transistors now on sale generally range from several tens to several hundreds, so that in the above circuit the composite $h_{FE}$ of the one output transistor and the polarity-reversing transistor and the $h_{FE}$ of the other output transistor are different from each other and an unbalanced output is obtained. The polarity-reversing transistor should have an $h_{FE}$ of one, but this is difficult to obtain.

SUMMARY OF THE INVENTION

Accordingly, one object of this invention is to provide a single-ended push-pull amplifier having two transistors of the same conductivity type at the output stage thereof so as to provide a balanced output.

Another object of this invention is to provide a single-ended push-pull amplifier employing polarity-reversing means which does not destroy the balance of two output transistors.

A further object of this invention is to provide a single-ended push-pull amplifier of good balance and small power consumption.

A still further object of this invention is to provide a single-ended push-pull amplifier which is suitable for integrated circuits.

Another object of this invention is to provide an inexpensive single-ended push-pull amplifier.

Other objects, features and advantages of this invention will become apparent from the following description taken in conjunction with the accompanying drawings.

DESCRIPTION OF THE PREFERRED EMBODIMENTS

Figure 1:
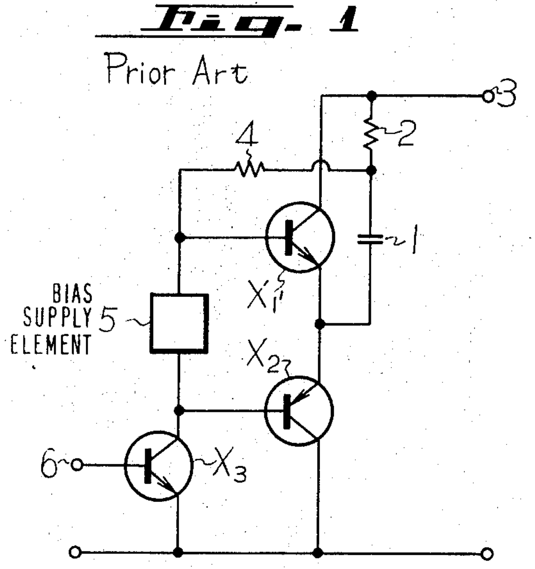
FIGS. 1 and 2 are schematics, respectively, illustrating conventional types of single-ended push-pull amplifiers according to the prior art.

In FIG. 1 there is illustrated a prior art single-ended push-pull amplifier, in which NPN-type and PNP-type transistors $X_1'$ and $X_2$ of different conductivity types are connected in series in the forward direction and their emitter connection point is connected through a capacitor 1 to one end of a load 2 having the other end connected to, for example, a power source terminal 3. The junction point between the load 2 and the capacitor 1 is connected to the collector of a drive transistor $X_3$ through a series circuit of bias supply elements 4 and 5. The transistor $X_3$ has its base connected to an input termnal 6, the emitter is grounded and the collector is connected to the base of the output transistor $X_2$. The junction point between the bias supply elements 4 and 5 is connected to the base of the output transistor $X_1'$.

Figure 2:
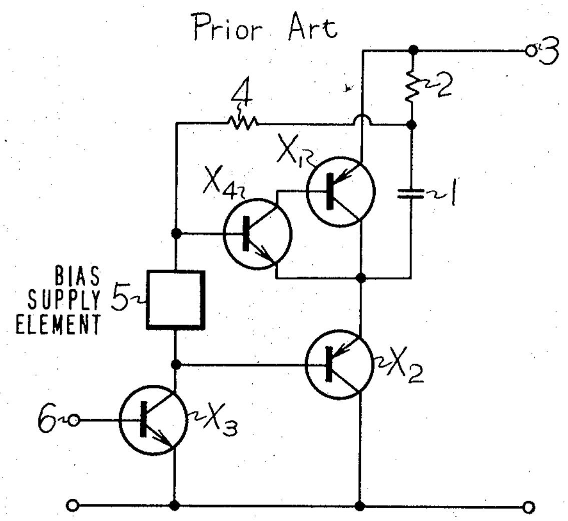

FIG. 2 similarly shows another example of a prior art single-ended push-pull amplifier, which employs two transistors of the same conductivity type as output transistors and in which they are connected in series with each other in the forward direction and an NPN-type transistor $X_4$ for polarity reversing is connected to one of the transistors, for example, $X_1$ in the figure. That is, the collector and emitter of the transistor $X_4$ are respectively connected to the base and collector of the output transistor $X_1$ to actuate both transistors $X_1$ and $X_4$ as one NPN-type transistor.

These prior art amplifiers have the difficulties described under "Background of the Invention."

Figure 3:
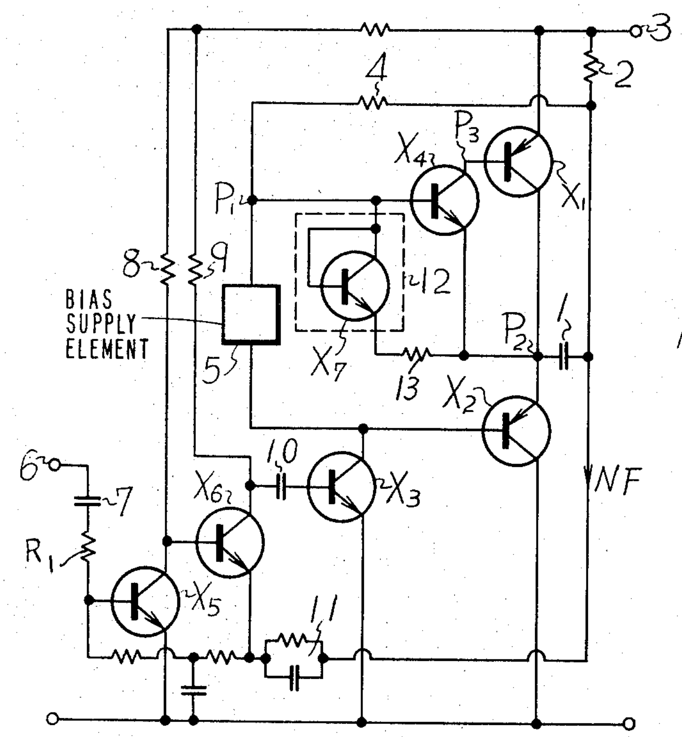
FIG. 3 is a schematic showing one example of a single-ended push-pull amplifier produced according to this invention.

In FIG. 3 there is illustrated one example of this invention in which similar elements to those in FIG. 2 are identified by similar reference numerals and in which a drive circuit of a stage prior to the driving transistor is illustrated. An input terminal 6 is connected through a coupling capacitor 7 and resistor $R_1$ to the base of a driving transistor $X_5$. The collector of $X_5$ is connected through a load resistor 8 to a power source terminal 3 and is directly connected to the base of a driving transistor $X_6$. The collector of the transistor $X_6$ is, in turn, connected through a load resistor 9 to the power source terminal 3 and is connected through a coupling capacitor 10 to the base of a driving transistor $X_3$. Further, the emitter of the transistor $X_6$ is connected through a feedback circuit 11 to the connection point between a load 2 and a capacitor 1.

In accordance with this invention a low impedance element 12 is connected between the emitter and base of a polarity-reversing transistor $X_4$. In the figure, the collector and base of a transistor $X_7$ are connected. A series circuit of the collector and emitter of the transistor $X_7$ and a resistor 13 is connected in parallel with the base and emitter of the polarity-reversing transistor $X_4$ in such a manner that the polarity between the collector and emitter of the transistor $X_7$ may be the same as that between the base and emitter of the transistor $X_4$. With such an arrangement, if the value of the resistor 13 is selected to be zero, the apparent $h_{FE}$ of the polarity-reversing transistor $X_4$ can be made to be approximately 1. This will be discussed based upon equations and the equivalent circuit depicted in FIG. 4.

Figure 4:
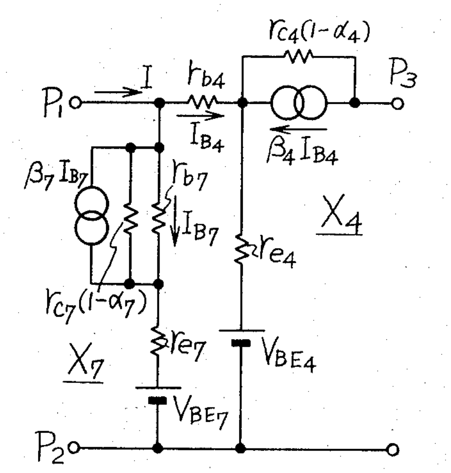
FIG. 4 is an equivalent circuit of the principal part of the amplifier exemplified in FIG. 3.

In FIG. 4 there is illustrated the equivalent circuit of the transistors $X_4$ and $X_7$, in which reference character $r_{b4}$ designates a base resistance of the transistor $X_4$, $r_{c4}$ a collector resistance, $r_{e4}$ an emitter resistance, $I_{B4}$ a base DC current, $\beta_4$ an emitter-grounded short-circuit current amplification factor, $\alpha_4$ a base-grounded short-circuit amplification factor, $V_{BE4}$ a DC voltage between the base and emitter, $r_{b7}$ a base resistance of the transistor $X_7$, $r_{c7}$ a collector resistance, $r_{e7}$ an emitter resistance, $\beta_7$ an emitter-grounded short-circuit current amplification factor, $\alpha_7$ a base-grounded short-circuit current amplification factor, $I_{B7}$ a base DC current, $V_{BE7}$ a DC voltage between the base and emitter, $P_1$ the connection point between the bias supply elements 4 and 5, $P_2$ the connection point between the collector and emitter of the transistors $X_1$ and $X_2$, and $P_3$ the connection point between the base and collector of the transistors $X_1$ and $X_4$. If a current applied to the transistors $X_4$ and $X_7$ from the connection point $P_1$ is I, $$I=I_{B7}(\beta_7+1)+I_{B4} \quad (1)$$

$$I_{B7}\cdot r_{b7}+I_{B7}(1+\beta_7)r_{e7}+V_{BE7}=I_{B4}\cdot r_{b4}+r_{e4}\cdot I_{B4}(1+\beta_4)+V_{BE4} \quad (2)$$

where $r_{c7}(1-\alpha_7)$ and $R_{c4}(1-\alpha_4)$ are substantially greater than $r_{b7}$ and $r_{b4}$ and can be neglected. If $V_{BE4}\doteqdot V_{BE7}$ and $r_{b4}\doteqdot r_{b7}$, Equation 2 may be written as:

$$I_{B7}\cdot r_{b7}+I_{B7}(1+\beta_7)r_{e7}=I_{B4}\cdot r_{b4}+r_{e4}\cdot I_{B4}(1+\beta_4) \quad (3)$$

It is possible that $$r_{e4}\doteqdot\frac{K}{I_{B4}(1+\beta_4}\text{ and that }r_{e7}\doteqdot\frac{K}{I_{B7}(1+\beta_7)}$$

where K is a constant. Accordingly, the Equation 3 may be written as follows:

$$I_{B4}\cdot r_{b4}=I_{B7}\cdot r_{b7} \quad (4)$$

Namely, $I_{B4}=I_{B7}$, and accordingly it follows from Equation 1 that $$I=I_{B7}(\beta_7+2)=I_{B4}(\beta_7+2) \quad (5)$$

Thus, since the current from the current source on the collector side of the transistor $X_4$, that is, on the side of the connection point $P_3$ in FIG. 4 can be expressed as $\beta_4\times I_{B4}$, the ratio of this current to the current I becomes a composite $h_{FE}$ of the polarity-reversing transistor $X_4$ and the transistor $X_7$ functioning as an impedance element. That is, the composite $h_{FE}$ of the transistors is as follows:

$$\beta_4\cdot I_{B4}/I=\frac{\beta_4\cdot I_{B4}}{(\beta_7+2)I_{B4}}=\frac{\beta_4}{\beta_7+2}\doteqdot 1 \quad (6)$$

where $\beta_7$ is nearly equal to $\beta_4$ and they are sufficiently greater than 2. Thus, if the current amplification factors $\beta$ of the polarity-reversing transistor $X_4$ and the transistor $X_7$ with diode connection as the low impedance element 12 are equal to each other, the composite $h_{FE}$ can be made to be approximately 1, so that the composite $h_{FE}$ including the output transistor $X_1$ can be rendered substantially equal to the $h_{FE}$ of the transistor $X_2$, ensuring the provision of a well-balanced push-pull amplifier circuit. Especially when the transistors $X_4$ and $X_7$ are simultaneously formed on the same substrate in adjacent positions in the form of a solid circuit or as a semiconductor integrated circuit, the characteristics of the transistors can readily be made uniform and the composite $h_{FE}$ can be rendered exactly 1. Further, in this case the transistors $X_4$ and $X_7$ can be formed together with the other amplifying elements, for example, the transistors $X_3$, $X_6$, $X_5$ at the same time.

Figure 5:
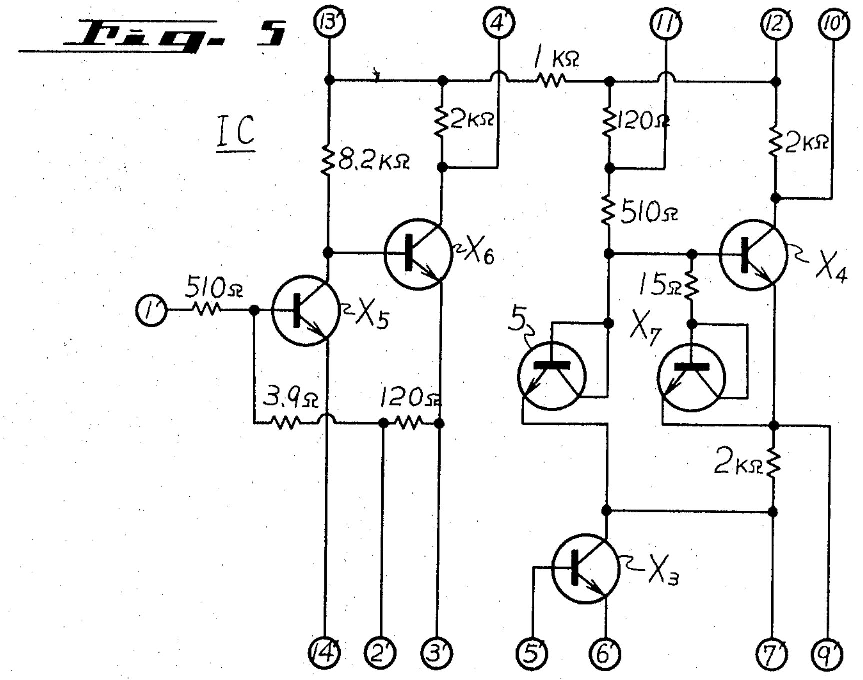
FIG. 5 is a schematic of a driving unit of an output transistor of the amplifier of this invention, constructed in the form of an integrated circuit.

FIG. 5 illustrates one example in which the drive unit of such an output transistor has been made in the form of an integrated circuit. The component values are given on the drawings for a specific circuit. Namely, a polarity-reversing transistor $X_4$, a transistor $X_7$ connected as a diode between the base and emitter of the transistor $X_4$, a transistor 5 of diode connection for bias supply to output transistors $X_1$ and $X_2$ and driving transistors $X_5$ and $X_6$ are all npn-type transistors, and an input terminal 1' is connected to the base of the transistor $X_5$ and output terminals 7' and 10' are respectively connected to the collectors of the transistors $X_3$ and $X_4$.

Figure 6:
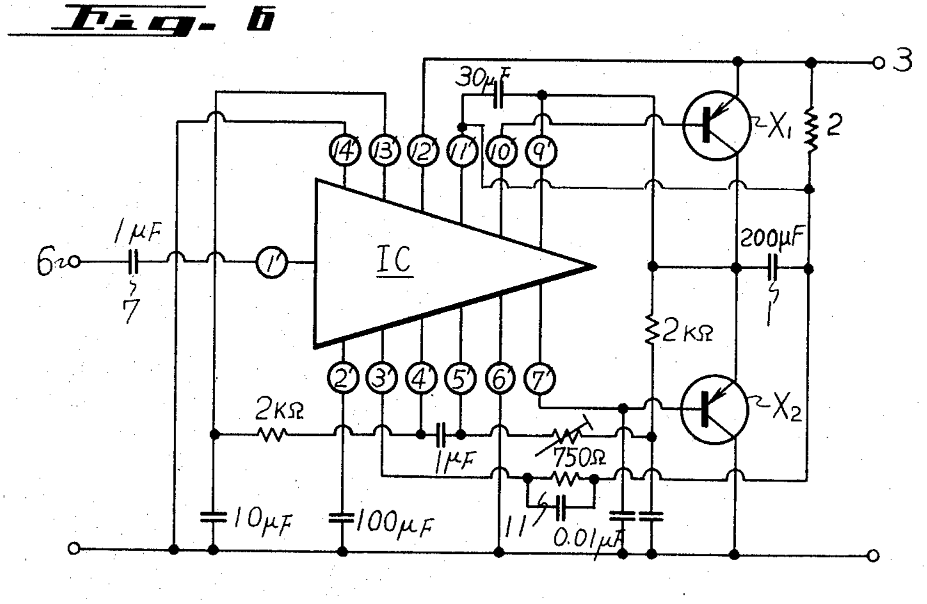
FIG. 6 is a schematic illustrating one example of the single-ended push-pull amplifier employing the integrated circuit shown in FIG. 5.

In FIG. 6 there is illustrated one example of the single-ended push-pull amplifier employing the integrated circuit IC shown in FIG. 5, and in this example similar elements as those in FIGS. 3 and 5 are indicated by the same reference numerals and characters and the description will not be repeated. Loads are connected between the output terminals and ground.

Since transistors of large output are difficult to obtain in the making of the above transistors in the form of an integrated circuit, unit transistors may be used as the output transistors $X_1$ and $X_2$. In FIG. 3 a large amount of base current can be applied to the output transistor $X_2$, directly connected to the driving transistor $X_3$, from the power source 3 through the load 2, the capacitor 1, the emitter and base of the transistor $X_2$ and the collector and emitter of the transistor $X_3$. With respect to the other output transistor $X_1$ disconnected from the transistor $X_3$, the potential at the point $P_2$ is one-half of the power source voltage $E_b$ and the potential at the point $P_1$ is given as follows:

$$P_1=E_b-(\tfrac{1}{2}\cdot E_b-V_{BE})$$

where $V_{BE}$ is a substantially constant base-emitter voltage of the transistor $X_4$. If the resistance value of the load 2 is taken as $R_L$, the base current of the transistor $X_4$ is taken as $I_b$, the output current of the transistor $X_1$ is taken as $I_L$ and the resistance value of the resistor 4 is taken as $R_c$, $$I_b=\frac{1/2\cdot E_b-V_{BE}}{R_c}\doteqdot\frac{I_L}{\text{composite }h_{FE}\text{ of }X_4\text{ and }X_7\cdot h_{FE}\text{ of }X_1}$$

$$I_L=\frac{1/2\cdot E_b}{R_L}=\frac{E_b}{2R_L}$$

$$\therefore I_b\doteqdot\frac{E_b}{2R_L\cdot\text{composite }h_{FE}\text{ of }X_4\text{ and }X_7\cdot h_{FE}\text{ of }X_1}$$

Consequently, the current is held constant and it is preferred that the composite $h_{FE}$ of the transistors $X_4$ and $X_7$ exceeds 1 for decreasing this current. With the composite $h_{FE}$ being too great, the construction of such a circuit will lose its meaning and the output becomes unbalanced to cause distortion in the output signal. However, since negative feedback is generally effected between the output stage and the driving stage by means of a feedback circuit 11 as illustrated, slight unbalance in $h_{FE}$ would not matter. For example, the composite $h_{FE}$ is selected to be greater than 1 but less than 10, and the composite $h_{FE}$ of such a value causes a decrease in the driving current and serves to lower the power consumption especially when a battery is used as a power source. In the case where the composite $h_{FE}$ is selected a little greater than 1, the value of the resistor 13 connected in series with the transistor $X_7$ with diode connection is selected not to be zero. When the resistor 13 has a certain value, the $h_{FE}$ varies a little with an increase in the collector current but substantially no distortion is introduced by the negative feedback effect mentioned above and power dissipation can be reduced.

Figure 7:
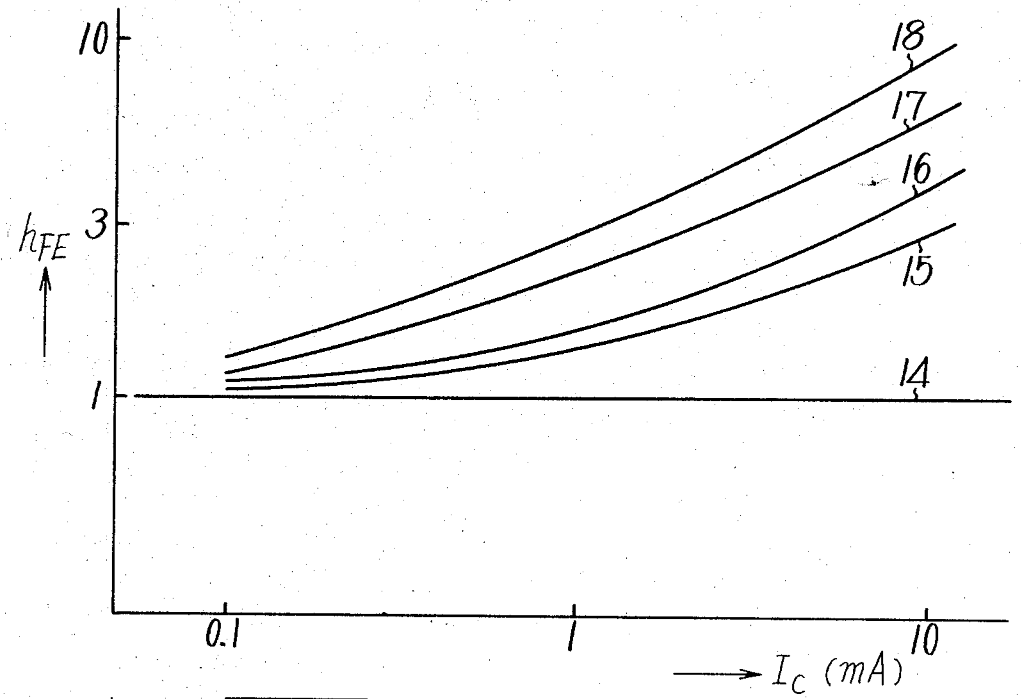
FIGS. 7 and 8 are, respectively, graphical representations of the $h_{FE}$-collector current $I_c$ characteristics.
Figure 8:
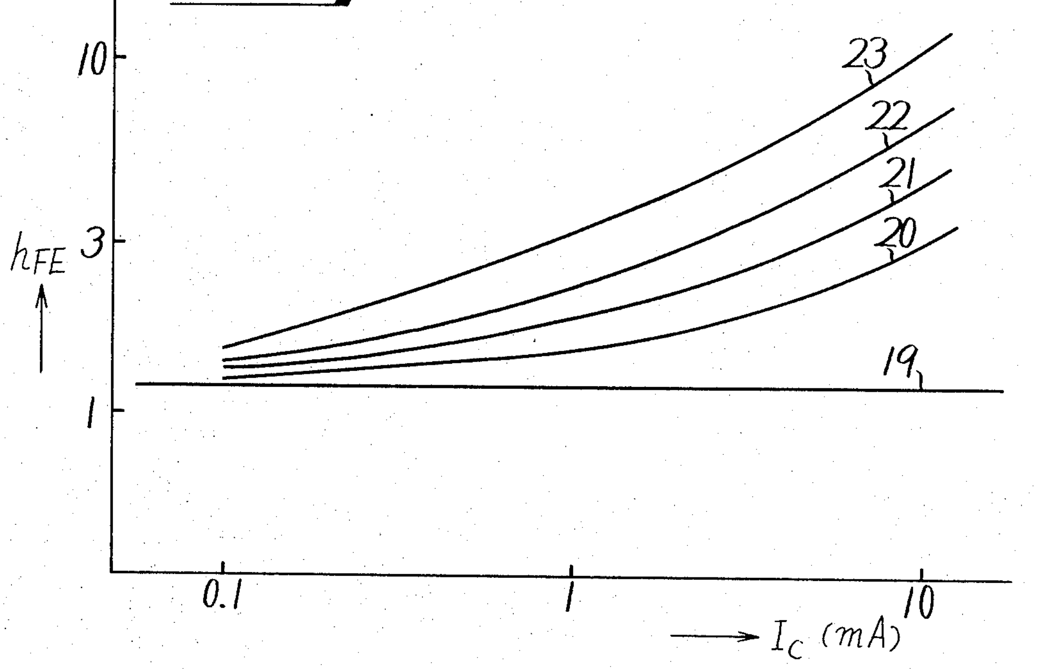

FIG. 7 shows the collector current $I_c$ characteristics of the transistors $X_4$ and $X_7$ relative to their composite $h_{FE}$, in which curves 14, 15, 16, 17 and 18, respectively, indicate the characteristics corresponding to the resistance values R of the resistor 13 being 0, 10Ω, 20Ω, 40Ω, and 80Ω. It appears from the graph that when the resistance value is zero, that is, when the resistor 13 is not present, the $h_{FE}$ is 1 irrespective of the collector current and that when the resistor 13 is in circuit, the $h_{FE}$ increases with an increase in the collector current and in addition the increase of $h_{FE}$ becomes greater with an increase in the resistance value. The characteristic curves were obtained with $h_{FE}$ of the transistors $X_4$ and $X_7$ being 150. When $h_{FE}$ of the transistors is 300, the transistors exhibit similar characteristics, as shown in FIG. 8. In the graph curves 19 to 23 indicate the cases when the resistance values R of the resistor 13 are zero, 10Ω, 20Ω, 40Ω, and 80Ω. From this graph it will be seen that characteristics similar to those in FIG. 7 are obtained.

In accordance with this invention a semi-complementary single-ended push-pull amplifier can be produced by using PNP-type transistors as output transistors, as has been described above. In this case the polarity-reversing transistor is used but the composite $h_{FE}$ of the polarity-reversing transistor and the one output transistor and the $h_{FE}$ of the other output transistor can be apparently substantially equal to each other, and, if necessary, the apparent $h_{FE}$ of the polarity-reversing transistor can be selected greater than 1 so as not to introduce distortion in the output signal and to reduce the driving current.

It will be apparent that many modifications and variations may be effected without departing from the scope of the novel concepts of this invention.

We claim as our invention:

1. A transistor push-pull amplifier comprising,
- two transistors of the same conductivity type, the emitter of one of the transistors being connected in series to the collector of the other transistor,
- means for supplying power to the transistors,
- a load connected to the junction point between the emitter and collector of the transistors,
- a polarity-reversing transistor connected to the base of one of the transistors,
- an impedance element connected between the base and emitter of the polarity-reversing transistor, and
- driving means connected to the base of the other transistor and the base of the polarity-reversing transistor, wherein the impedance element is a transistor having the same characteristics as the polarity-reversing transistor and connected as a diode.

2. A transistor push-pull amplifier comprising,
- two transistors of the same conductivity type, the emitter of one of the transistors being connected in series to the collector of the other transistor,
- means for supplying power to the transistors,
- a load connected to the junction point between the emitter and collector of the transistors,
- a polarity-reversing transistor connected to the base of one of the transistors,

- an impedance element connected between the base and emitter of the polarity-reversing transistor, and
- driving means connected to the base of the other transistor and the base of the polarity-reversing transistor, wherein the impedance element consists of a series connection of a resistor and a transistor having the same characteristics as the polarity-reversing transistor and connected as a diode.

3. A transistor push-pull amplifier comprising,
- two transistors of the same conductivity type, the emitter of one of the transistors being connected in series to the collector of the other transistor,
- means for supplying power to the transistors,
- a load connected to the junction point between the emitter and collector of the transistors,
- a polarity-reversing transistor connected to the base of one of the transistors,
- an impedance element connected between the base and emitter of the polarity-reversing transistor, and
- driving means connected to the base of the other transistor and the base of the polarity-reversing transistor, wherein the composite $h_{FE}$ of the polarity-reversing transistor and the impedance element are in the range between 1 to 10.

4. A transistor push-pull amplifier comprising,
- two transistors of the same conductivity type, the emitter of one of the transistors being connected in series to the collector of the other transistor,
- means for supplying power to the transistors,
- a load connected to the junction point between the emitter and collector of the transistors,
- a polarity-reversing transistor connected to the base of one of the transistors,
- an impedance element connected between the base and emitter of the polarity-reversing transistor, and
- driving means connected to the base of the other transistor and the base of the polarity-reversing transistor, wherein the polarity-reversing transistor, the impedance element and the driving means are transistors of the same conductivity type.

5. A transistor push-pull amplifier as claimed in claim 1 wherein the driving means is connected directly to the base of the other transistor, a bias supply element connected to the base of the polarty-reversing transistor, and said driving means connected to said bias supply element.

6. A transistor push-pull amplifier as claimed in claim 1 wherein the polarity-reversing transistor, the impedance element and the driving means are formed on the same semiconductor substrate.

References Cited

UNITED STATES PATENTS

| | | | |
|---|---|---|---|
| 3,418,590 | 12/1968 | Rongen et al. | 330—14 |
| 3,023,368 | 2/1962 | Erath | 330—14 |
| 3,441,864 | 4/1969 | Hafler | 330—13X |

ROY LAKE, Primary Examiner

S. H. GRIMM, Assistant Examiner

U.S. Cl. X.R.

330—17, 19, 22, 40